United States Patent [19]

Mack et al.

[11] Patent Number: 4,603,023

[45] Date of Patent: Jul. 29, 1986

[54] METHOD OF MAKING A HYBRID DIELECTRIC PROBE INTERPOSER

[75] Inventors: Alfred Mack, Poughkeepsie; Michael F. McAllister, Clintondale, both of N.Y.

[73] Assignee: International Business Machines Corporation, Armonk, N.Y.

[21] Appl. No.: 556,865

[22] Filed: Dec. 1, 1983

[51] Int. Cl.[4] .................. B32B 1/10; B32B 31/06; H01R 9/09; H05K 13/00
[52] U.S. Cl. .................. 264/135; 29/842; 29/844; 29/854; 29/855; 29/856; 264/261; 264/262; 333/243; 333/245
[58] Field of Search .................. 264/135, 261, 262; 29/842, 844, 854–856; 156/48; 333/243–245

[56] References Cited

U.S. PATENT DOCUMENTS

| | | | |
|---|---|---|---|
| 2,255,184 | 9/1941 | Osenberg | 18/59 |
| 2,396,283 | 3/1946 | Papst | 29/155.5 |
| 2,444,997 | 7/1948 | Lovesey | 18/59 |
| 2,813,922 | 11/1957 | Arnold | 264/262 X |
| 3,243,760 | 3/1966 | Dupre | 339/153 |
| 3,351,702 | 11/1967 | Stephens | 174/68.5 |
| 3,388,212 | 6/1968 | Nichols et al. | 174/153 |
| 3,490,731 | 12/1949 | Bradley | 249/95 |
| 3,499,219 | 3/1970 | Griff et al. | 29/624 |
| 3,734,995 | 5/1973 | Thomas | 264/322 |
| 3,837,074 | 9/1974 | Griff | 29/624 |
| 4,090,294 | 5/1978 | Parr | 29/628 |
| 4,161,817 | 7/1979 | Bernardo et al. | 29/630 |
| 4,195,272 | 3/1980 | Boutros | 333/182 |

FOREIGN PATENT DOCUMENTS

| | | |
|---|---|---|
| 3030101 | 3/1982 | Fed. Rep. of Germany . |
| 2461369 | 1/1981 | France .................. 333/245 |
| 579128 | 7/1946 | United Kingdom . |
| 686118 | 1/1953 | United Kingdom . |

Primary Examiner—Jan Silbaugh
Attorney, Agent, or Firm—Sughrue, Mion, Zinn, Macpeak, and Seas

[57] ABSTRACT

A coaxial line as a rigid probe interposer is particularly useful for connecting an electrical tester to a high speed integrated circuit utilizes two coaxial dielectrics for spacing a center conductor from an outer conductor in the form of a holed metallic body. The line center conductor is initially coated with a first dielectric. The dielectric coated center conductor is thereafter positioned in an oversized hole within the conductive body. The annular free space existing between the inside wall of the hole and the outer circumference of the first dielectric is filled as by capillary action, with a second, liquid dielectric which flows into the fissures and cracks within the first dielectric prior to curing.

4 Claims, 1 Drawing Figure

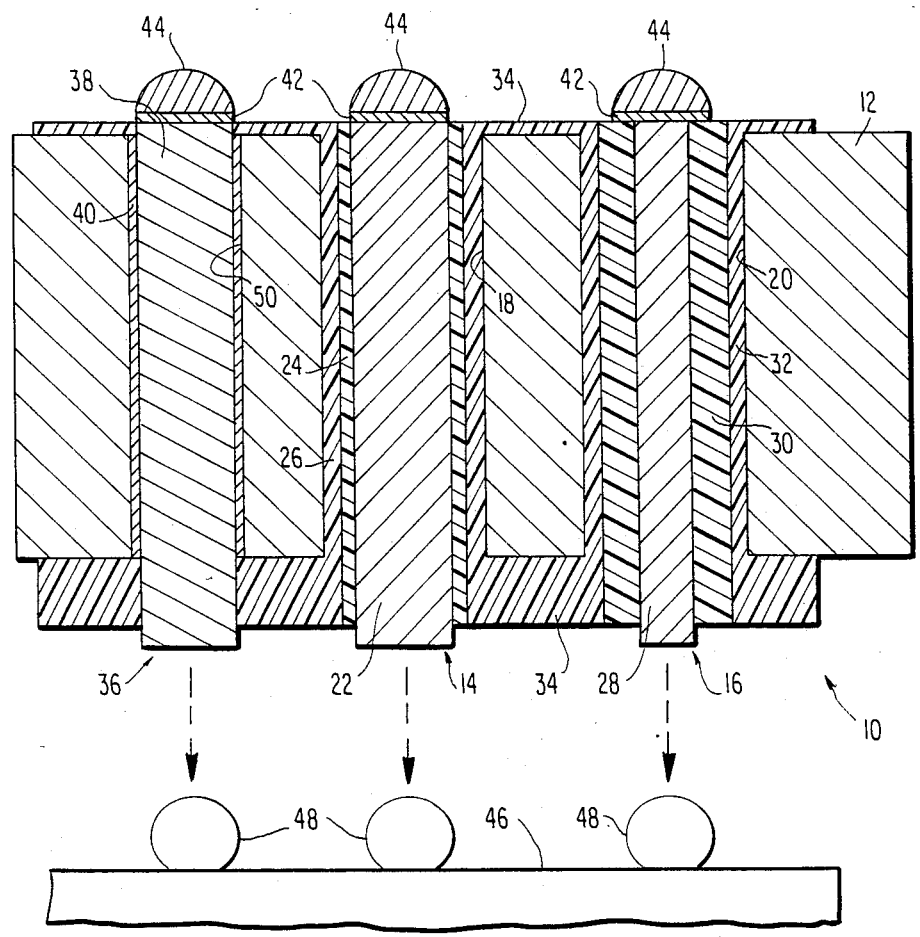

METHOD OF MAKING A HYBRID DIELECTRIC PROBE INTERPOSER

FIELD OF THE INVENTION

This invention relates to the fabrication of exceedingly small coaxial lines, particularly useful in high frequency testing integrated circuits and, more particularly, to a coaxial line rigid probe interposer which electrically matches the tester connections to the integrated circuits within the size constraints dictated by the integrated circuits.

BACKGROUND OF THE INVENTION

Attempts have been made to create coaxial lines by coating a wire with a thin dielectric material on which a deposit of copper and/or lead-tin is vapor deposited with the coaxial segments therein inserted into a metallic body having a predrilled hole, the inside of which is also vapor deposited with a thin coating of lead-tin. Such coaxial line interposers are then formed by soldering the segments to the metallic fixture.

In the development of a very high speed tester for integrated circuits, it is desirable to maintain a uniform 50 ohm signal impedance from the driver/receiver electronics to the device under test (DUT). At the same time, to minimize power distribution noise generated by the rapid change of current through a power lead, a low impedance for the power path is required.

In the fabrication of such rigid probe interposers, there are three major steps required to achieve a coaxial design for both the signal and voltage probes constituted by the integrated structure. The first is the fabrication of the voltage probe. In a typical prior design, a thin (3,000 Å) film of tantalum oxide is deposited on a 0.006 inch wire probe and a coating of copper and/or lead-tin is sputtered onto the outside surface of the oxide to form a low impedance coaxial segment. This involves several significant fabrication problems which must be overcome. First, the surface of the wire must be completely free of metal fragments and depressions on its surface so that the oxide can coat uniformly and so that no metal fragments are exposed. Secondly, when depositing the copper and/or lead-tin coating to the outside surface of the oxide, the possibility of pin holes or surface cracks in the oxide leads to an exposure of shorting the copper coating to the center conductor.

For the signal probe in such typical prior design, the fabrication entails depositing parylene on a 0.002 inch diameter wire to an overall thickness of 0.006 inches. Then chrome, copper and lead-tin is evaporated on the parylene surface. Again, a problem arises as there may be voids in the dielectric coatings such that the metallic deposit may short to the center conductor, rendering the probe useless.

The final process step is to form the completed interposer and integrating the voltage probe and the signal probe. The preformed coaxial segments for the voltage and signal probes are inserted into the required locations of a predrilled laminated brass body having parallel holes receiving the voltage and signal probes. The laminated sections have a deposit of lead-tin on each face. Once this is done, the entire fixture is brought above the melting temperature of the lead-tin to sweat all elements together. Then polyimide is applied to the probe surface for electrical isolation and stiffening of the exposed probe wire.

In a coaxial line formed of a central conductor covered with a thin layer of insulation, e.g. 3,000 Å of $Ta_2O_5$ and an outer metal sheath, e.g. deposited lead-tin or copper or both, voids in the dielectric material may provide a path for shorting the sheath to the central conductor.

It is therefore an object of the present invention to provide an improved rigid probe interposer for connecting a very high speed tester electronics to an integrated circuit under test in which the interposer is manufactured through a single step encapsulation of both signal and voltage probes, good electrical characteristics are provided for both probes, the interposer is of simplified construction and has good mechanical stability for extensive repetitive use.

SUMMARY OF THE INVENTION

The invention is directed in part to a coaxial line which comprises a central conductor having a first dielectric of first dielectric constant and thickness surrounding the central conductor, and a second dielectric having a second dielectric constant and thickness surrounding the entirety of the first dielectric and filling any voids in the first dielectric which arise at the interface of the second dielectric and the outer surface of the first dielectric and extend inwardly of the first dielectric, and an outer conductor receiving the central conductor first coaxial dielectric and second dielectric. For a given wire size and a given thickness of insulation of the first dielectric and a smaller thickness of insulation of the second dielectric, a lower impedance is formed when the first dielectric is substantially larger than the second dielectric than that formed if the two dielectrics were equal. Conversely, if the second dielectric were substantially larger than the first dielectric, a higher impedance may be formed. Thus, by different center conductor sizes, dielectric coatings thickness, and dielectric constants, different impedances may be obtained.

The invention is further directed to a method of manufacture of a compound dielectric coaxial line by a process comprising the steps of first forming a first dielectric of first dielectric constant and thickness about the outer surface of a central conductor and, secondly, providing an outer conductor having a cavity therein for receiving the central conductor coated with the first dielectric sized to form a free space between the entirety of the first dielectric outer surface and the inner surface of the cavity and, thirdly, placing the central conductor bearing the first dielectric within the cavity. Fourthly, the free space is filled with a second dielectric of second dielectric constant and thickness, such that the second dielectric fills any voids arising at the interface of the second dielectric and the first dielectric which extend inwardly from the first dielectric.

The process has application to and the product may comprise a rigid probe interposer for connection between a high speed electrical tester and an integrated circuit.

In one specific form, a predrilled metal nonferrous interposer body defines an array of equal diameter holes within which at least one voltage probe and at least one signal probe central conductor of different diameters are insertably positioned within given holes. For the larger diameter central conductor voltage probe, a thin polyimide precoat constituting the first dielectric has a different dielectric constant than a parylene precoat for the smaller diameter signal probe central conductor borne by the metallic interposer body. Narrow annular gaps define capillary passages between the precoated voltage probe and signal probe central conductors and the body bores which gaps may be filled with the second dielectric of different dielectric constant by capillary flow into the narrow annular gap. Preferably the outside surfaces of the brass interposer body are encapsulated by the same dielectric in liquid form which solidifies upon curing. The voltage probe central conductor may have a polyimide precoat. The signal probe central conductor may have a parylene precoat, and the encapsulating second dielectric liquid may constitute the same or a different polyimide from that of precoating the voltage probe central conductor.

BRIEF DESCRIPTION OF THE DRAWING

The single FIGURE is a vertical sectional view of the rigid probe interposer forming a preferred embodiment of the present invention.

DESCRIPTION OF THE PREFERRED EMBODIMENT

Referring to the single FIGURE, a hybrid dielectric probe interposer indicated generally at 10 forming a preferred embodiment of the present invention, functions as a rigid probe for the connection between a very high speed electronic tester and an integrated circuit under test, specifically, for instance, between a space transformer and the test wafer. In the illustrated embodiment, it is desirable that the signal path have a characteristic impedance of 50 ohms and minimize discontinuities on the signal path. At the same time, to minimize power distribution noise generated by the rapid change of current through a power lead, a low impedance for the power path is required. The present invention utilizes a metallic interposer body 12 which integrates as parts thereof voltage probe (indicated generally at 14) and signal probe (indicated generally at 16). To achieve that end, the metallic interposer body 12, which may be brass, is provided with two bores or holes as at 18 and 20, bore 18 bearing inner conductor elements of the voltage probe 14 while bore 20 bears inner conductor elements of signal probe 16. The metallic interposer body 12 constitutes the outer conductor for both coaxial probes 14 and 16.

In the implementation of the method of manufacture of the hybrid dielectric probe interposer 10 forming an aspect of the present invention, the achievement of the characteristic impedance of 50 ohms for the signal probe and the very low impedance for the voltage probe is accomplished by precoating probe wires with the required dielectric material and then the encapsulation of the wires with polyimide directly in the metallic interposer body 12 with the required footprint (relative to the test wafer). In that respect, a 0.0056 inch diameter wire is precoated with polyimide so that the total insulation is 0.0001 inch per each side. The metallic interposer body 12 is provided with bores 18 and 20 as predrilled holes of 0.006 inches diameter. Precoated probe wires 22 and 28 with precoatings 24 and 30 respectively are inserted in the desired hole locations. While the sectional view of the single FIGURE shows two drilled holes as at 18 and 20, it must be appreciated that the metallic interposer body 12 may have multiple rows of such holes at the locations required for the various probe wires 22 and 28. Insofar as hole or holes 18 are concerned and voltage probes partially defined by wires 22, if such is the only requirement for probe 10, liquid polyimide is then added to the fissure, as by dipping the assembly including the precoated wires into polyimide, or by dripping the liquid polymer onto the assembly, or through low pressure fixturing drawing the polymer through the assembly. By capillary action, the annular void or space between the precoated wires 22 and the hole diameter or bore 18 is filled with liquid polyimide. The liquid polyimide is cured and the voltage probe is thus encapsulated. As may be appreciated, this forms a hybrid of polyimide 24 to polyimide 26. The impedance is found to be 2.16 ohms for a dielectric constant polyimide of 3.67 for single probe fabrication:

$$Z_o = \frac{60}{\sqrt{\epsilon_r}} \ln \frac{r_2}{r_1}$$

For the signal probe 16 fabrication, a 0.0015 inch diameter probe wire 28 which may in similar fashion to wire 22 for the voltage probe be formed of a suitable conductor such as that sold under the trade name "Neyoro G", is precoated with parylene to form a precoat 30 to a final outside diameter of 0.0058 inches. The precoated wire 28 is inserted into the bore 20 of 0.006 inch diameter (or multiple coated wires 28 into multiple bores 20 for multiple signal probes 16) in the metallic interposer body 12. Liquid polyimide is then applied and fills the capillary passage between coated wire 28 as at 32 cured to form the coaxial system for the signal probe or probes as illustrated in the drawing.

For concentric conductors and dielectric boundary, the impedance is the sum of the impedances formed by the center conductor and the dielectric boundary, and the dielectric boundary to the wall of the predrilled hole (bores 18 and 20):

$$Z_o = Z_1 + Z_2$$
$$= \frac{60}{\sqrt{3.67}} \ln \frac{6.0}{5.8} + \frac{60}{\sqrt{2.65}} \ln \frac{5.8}{1.5}$$
(polyimide)  (parylene)

$$= 50.9 \text{ ohms}$$

Thus, with the hybrid dielectric fabrication, a 50 ohm coaxial probe can be effectively achieved.

Preferably, the coaxial system, as evidenced by the embodiment illustrated, as achieved by inserting a wire with a dielectric precoat into a drilled hole of a metallic body with small but sufficient clearance so that a liquid polyimide may be absorbed into the void between the brass body and coated wires by capillary action. When cured, this liquid polyimide encapsulates the probe wires to the metal fixture, thus forming a coaxial system with the metallic interposer body 12 as the external conductor.

For the voltage probe, since the precoat dielectric of polyimide also forms the encapsulating material, the coaxial impedance is found by the classical equation:

$$Z_o = \frac{60}{\sqrt{\epsilon_r}} \times \ln \frac{r_2}{r_1}$$

with $\epsilon_{r2} = \epsilon_r$ and with $r_2$ = radius of hole in body 12 $r_1$ = radius of wire of wire 22 because the precoat and the encapsulation material have equal dielectric values, only $\epsilon_r$ is needed and the classical equation holds for the voltage probe. The impedance is very small. The precoating of a 0.0056 inch wire with polyimide so that the final diameter is 0.0058 inches and inserting this into a 0.006 inch diameter hole or bore 18, adding the liquid polyimide and curing forms a 2.16 ohm coaxial voltage probe.

With respect to the signal probe 16, an understanding of the effects of multiple dielectric interfaces has on capacitance between two conductors must be considered. In essence, the capacitance between two conductors with two dielectrics is the series equivalent value of the capacitance formed between the center conductor and the dielectric boundary, and the capacitance from the dielectric boundary and the outer conductor. Thus, from the impedance equation $$Z_o = \sqrt{\frac{L}{C}}$$

it can be seen that the impedance is increased as the value c is lowered. The impedance of the hybrid dielectric signal probe is the sum of impedances calculated as follows: First, one impedance is obtained by treating the dielectric boundary as the outer conductor and using the classic equation with the dielectric enclosed, one obtains $Z_1$. Now by using the radius of the dielectric boundary as the inner conductor and with the outer conductor enclosing the second dielectric material, an impedance $Z_2$ is found. The total impedance is the sum of these two individual impedances $Z_T = Z_1 + Z_2$. Many different impedances may be obtained by changing the dielectric materials used and by varying the wire end or dielectric thicknesses.

As may be appreciated from the above, the present invention is directed to a coaxial line and its method of manufacture and particularly to a rigid probe interposer for connecting an electrical tester to a high speed integrated circuit which features the use of two coaxial dielectrics for spacing a center conductor from an outer conductor formed of a metallic body bearing a hole within which the center conductor resides. The use of two coaxial dielectrics which may be of the same chemical composition or different chemical composition and with the same or different dielectric constants, permits the achievement of required electrical impedance for the line within size constraints dictated by the integrated circuit size and facilitates the manufacturability of the line. To achieve desired electrical impedance characteristics and permit flexibility and center conductor sizing, the line center conductor is coated with a first dielectric. The dielectric coated center conductor is thereafter positioned in an oversized hole extending in the conductive body defining the outer coaxial conductor such that an annular free space exists between the inside wall of the hole and the outer circumference of the first dielectric. Preferably, the annular free space or cavity is sufficiently narrow that it will function as a capillary passage to provide flow of the liquid defining the second dielectric under capillary action. That annular free space is thereafter filled with a liquid dielectric such that it flows in the first dielectric to fill, for example, fissures and cracks if they exist within the first dielectric. The polyimide which not only defines the second and outer dielectric about the precoated probe wire, but also encapsulates the complete metal body forming the outer conductor for the coaxial lines, constitutes a class of polymer dielectric materials and the parylene also comprises a polymer. Typically, the polyimide may be a high heat resistant 703 resin sold under the trademark SKYBOND by Monsanto Corporation and the parylene may be TYPE N manufactured by Union Carbide Corporation.

In the manufacturing process, the polyimide is applied by coating to the top of the metallic interposer body 12 in the FIGURE, with the liquid polyimide flowing into the annular space between precoated voltage probe wires 22 and the precoated signal probe wires 28 prior to curing. This flow of encapsulating liquid functions to encapsulate the top of the metallic interposer body with the voltage probe and signal probe in place, while the flow of some of the applied polyimide by capillary action into the annular capillary passage spaces defined by bores 18 and 20 and precoats 24 and 30, for wires 22 and 28, respectively, also causes centering of the precoated wires by expansion of the encapsulating polyimide during curing in the bores 18 and 20.

In addition to allowing a large number of holes 18 and 20 to develope an array of voltage probes and signal probes as at 14 and 16, respectively, there may also exist a ground probe, as at 36, constituted by a ground conductor 38 bonded to the metallic body 12 at bore 50 with solder or suitable material 40 to form a connection from the metallic body itself to the wafer (integrated circuit) under test. Further, after polyimide encapsulation or during such encapsulation and the creation of polyimide 34 coat to the upper surface of the metallic interposer body 12, additional polyimide as at 34 is applied to the bottom of that body about the projecting ends of the voltage probe and signal probe conductors 22 and 28, the effect of which is to fully encapsulate the array probes 14, 16 and 36 to provide stiffening to maintain probe tip alignment and also to prevent conductor to body shorting. Also, because the various probes 14, 16 and 36 have conductors of different diameter, it is necessary to evaporate metal pads 42 of uniform diameter onto the exposed ends of the various probe conductors 22, 28, 38, achieved by sputtering through a suitable mask, after which solder is applied to form uniform size solder dots as at 44 defined by the pad size.

In use, the hybrid dielectric probe interposer moves into contact with the solder spheres 48 on wafer 46 as indicated by the arrows in the single FIGURE, thereby effecting low impedance circuit connections between the test apparatus and the wafer with direct contact between the lower ends of the probe conductors 22, 28, 38 and the solder spheres 48.

As may be appreciated, the characteristic impedance of the the signal probe is raised by keeping the diameter of the wire conductor small, while the characteristic impedance may be lowered for the voltage probe by maintaining a relatively large wire diameter. As may be additionally appreciated, by utilizing the rigid interposer probe of the present invention, this eliminates the current techniques where each probe flows and is capable of shorting between the lead-tin or copper around the sheaths of insulator material.

While the invention has been particularly shown and described with reference to a preferred embodiment thereof, it will be understood by those skilled in the art that various changes in form and details may be made therein without departing from the spirit and scope of the invention.

I claim:

1. A method for making a hybrid dielectric rigid probe interposer capable of maintaining uniform signal impedance from driver/receiver electronics to an integrated circuit under test while achieving high speed testing of same, said method comprising the steps of:
provbrevity a central conductor;
forming a first dielectric of first dielectric constant about the outer surface of said central conductor;
providing an outer conductor having a cavity therein for receiving said central conductor coated with said first dielectric such that a free space exists between the entirety of said first dielectric outer surface and the inner surface of said cavity;
and wherein said step of forming said outer conductor with a cavity therein comprises sizing the cavity to the diameter of the central conductor and the first dielectric formed thereabout, such that the free space existing between the first dielectric outer surface and the inner surface of the cavity defines a capillary passage, and flowing a second dielectric in liquid form having a second dielectric constant into the free space by capillary action due to the surface tension of the second liquid dielectric to the bore of the cavity bearing the coated central conductor, to completely fill said free space, and curing said liquid second dielectric such that said second dielectric fills any voids arising at the interface of the second dielectric and said first dielectric which extend inwardly in said first dielectric, such that the precoated central conductor is centered within said cavity by expansion of the second dielectric during curing, thereby enabling the fabrication of an exceedingly small coaxial line dielectric probe interposer which is free of shorts between the central conductor and said outer conductor.

2. A method for manufacturing a rigid probe interposer for connecting a high speed electrical tester to an integrated circuit said method comprising:
forming a plurality of through holes within an electrically conductive body constituting the outer conductor of a plurality of coaxial lines partially defined thereby, and wherein electrical conductors mounted within said holes and separated by dielectrics comprise central conductors for said coaxial lines, the improvement wherein said method further comprises the steps of:
forming all of said holes within said body of the same given diameter,
forming at least one of said central conductors of a relatively large diameter for functioning as a voltage probe and at least one other central conductor of relatively small diameter for functioning as a signal probe,
forming first dielectrics of given dielectric constants and thicknesses about the outer surface of respective central conductors,
placing each central conductor bearing said given first dielectric coating within said respective holes of said body, and
filling the free space between said coated central conductor and the hole wall with a second dielectric of given dielectric constant and thickness, such that said second dielectric fills any voids arising at the interface of said second dielectric and said first dielectric which extends inwardly within said first dielectric, and
matching the dielectric constants of said first and second dielectrics for respective voltage and signal probes to the impedance requirements for both said voltage probe and said signal probe components of the rigid probe interposer related to their functions and to the integraged circuit and electrical tester connections formed thereby.

3. The method as claimed in claim 2, wherein the first dielectric surrounding the central conductor defining said at least one voltage probe and that surrounding said central conductor defining said at least one signal probe are of different dielectric constants, and of different thicknesses, wherein the size of the holes relative to the diameter of said central conductors and the first dielectrics formed thereabout, define a free space functioning as a capillary passage, and the step of filling said free spaces comprises the step of flowing said second dielectric in liquid form into said free space for both the voltage and signal probes by capillary action due to the surface tension of said second dielectric liquid to the bore of the hole bearing the coated central conductor and curing said liquid second dielectric, and wherein said second dielectric for both said voltage probe and said signal probe, comprise the same chemical composition having the same dielectric constant and are of equal thickness.

4. The method as claimed in claim 3, wherein said first dielectric for said at least one voltage probe comprises a polyimide, said first dielectric for said at least one signal probe comprises parylene, and wherein said second dielectric comprises for both said at least one voltage probe and said at least one signal probe the same polyimide.

* * * * *